United States Patent
Burkhardt et al.

(10) Patent No.: US 12,362,753 B2
(45) Date of Patent: Jul. 15, 2025

(54) ELECTRICAL CIRCUIT

(71) Applicant: Fraunhofer-Gesellschaft zur Foerderung der angewandten Forschung e.V., Munich (DE)

(72) Inventors: Frank Burkhardt, Erlangen (DE); Stefan Lipp, Erlangen (DE); Kirsten Schuh, Erlangen (DE); Jorge Luis Juárez Peña, Erlangen (DE); Christian Skubich, Dresden (DE); Nico Peter, Dresden (DE); Jürgen Hupp, Erlangen (DE); Thomas Windisch, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 47 days.

(21) Appl. No.: 18/181,388

(22) Filed: Mar. 9, 2023

(65) Prior Publication Data

US 2023/0216507 A1 Jul. 6, 2023

Related U.S. Application Data

(63) Continuation of application No. PCT/EP2021/074891, filed on Sep. 10, 2021.

(30) Foreign Application Priority Data

Sep. 11, 2020 (EP) .................................. 20195749

(51) Int. Cl.
*H03L 7/00* (2006.01)
*G06F 1/12* (2006.01)
*H03L 1/00* (2006.01)

(52) U.S. Cl.
CPC .................. *H03L 7/00* (2013.01); *G06F 1/12* (2013.01); *H03L 1/00* (2013.01)

(58) Field of Classification Search
CPC ................ H03L 7/00; H03L 1/00; G06F 1/12
See application file for complete search history.

(56) References Cited

U.S. PATENT DOCUMENTS

| | | | |
|---|---|---|---|
| 6,973,400 B2 | 12/2005 | Cahill-obrien et al. | |
| 7,920,663 B1 | 4/2011 | Stevens | |
| 2005/0007887 A1 | 1/2005 | Sorrells et al. | |
| 2005/0080579 A1 | 4/2005 | Cahill-Obrien et al. | |

(Continued)

FOREIGN PATENT DOCUMENTS

| | | |
|---|---|---|
| CN | 110736957 A | 1/2020 |
| JP | 2006033703 A | 2/2006 |

OTHER PUBLICATIONS

"Fast automation" [Online]: https://de.fast-zwanzig20.de/industrie/fast-automation—with cover page—Fraunhofer—2023 (3 pages).

(Continued)

*Primary Examiner* — Janice N Tieu
(74) *Attorney, Agent, or Firm* — Perkins Coie LLP; Michael A. Glenn

(57) ABSTRACT

An electrical circuit, having: an oscillating element configured to provide a clock signal; and a clock synchronization unit configured to adapt the clock signal based on a reference signal; wherein the clock synchronization unit is configured to extract from an alternating signal the reference signal.

17 Claims, 5 Drawing Sheets

(56) References Cited

U.S. PATENT DOCUMENTS

| | | | |
|---|---|---|---|
| 2005/0085259 | A1 | 4/2005 | Conner et al. |
| 2009/0015174 | A1* | 1/2009 | Huang .................. H05B 45/22 |
| | | | 315/246 |
| 2011/0140905 | A1* | 6/2011 | Maciorowski ........ G06F 11/325 |
| | | | 340/815.4 |
| 2011/0208329 | A1 | 8/2011 | Castor-perry |
| 2014/0104006 | A1 | 4/2014 | Clark et al. |
| 2016/0036421 | A1* | 2/2016 | Bae ...................... H04B 10/116 |
| | | | 327/114 |

OTHER PUBLICATIONS

"Fast realtime," [Online]: https://de.fast-zwanzig20.de/basisvorhaben/fast-realtime—with cover page—Fraunhofer (6 pages).

https://www.vectron.com/products/shock_vib/shockvibe_index.htm—with cover page.

John C. Eidson et al., IEEE-1588 Standard for a Precision Clock Synchronization Protocol for Networked Measurement and Control System IEEE 1588-2002 (pp. 243-254).

Pena, UWIN: Ultra Low Latency Wireless Industrial Network—Fraunhofer (13 pages).

Schulze, D., Gnatt, A. und Krätzig, M., Anforderungsprofile im ZDKI, Oct. 26, 2016. [Online]: http://www.industrialradio.de/Publications/ZDKI-FG1_AnforderungsProfile_041116.pdf. (48 pages).

The Institute of Electrical and Electronics Engineers,, IEEE Standard for a Precision Clock Synchronization Protocol for Networked Measurement and Control Systems. IEEE Std. 1588-2002, New York 2002, ISBN 0-7381-3369-8 (Part 1 of 2—pp. 1-144).

The Institute of Electrical and Electronics Engineers,, IEEE Standard for a Precision Clock Synchronization Protocol for Networked Measurement and Control Systems. IEEE Std. 1588- 2002, New York 2002, ISBN 0-7381-3369-8 (Part 2 of 2—pp. 145-269).

Frotzscher, A., Wetzker, U., Bauer, M., Rentschler, M., Beyer, M., Elspass, S. und Klessig, H., Requirements and current solutions of wireless communication in industrial automation, in IEEE International Conference on Communications Workshops (ICC), Sydney, 2014 (6 pages).

Aktas, I., Bentkus, A., Bonanati, F., Dekorsy, A., Dombrowski, C. , Doubrava, M. , Golestani, A., Hofmann, F., Heidrich, M., Hiensch, S., Kays, R., Meyer, M., Müller, A., ten Brink, S., Petreska, N., Popovic, M., Rauchhaupt, L., Saad, A., Schotten, H., Wöste, C. und Wolff, I., „Funktechnologien für Industrie 4.0, VDE ITG, Frankfurt am Main, 2017 (56 pages).

The Institute of Electrical and Electronics Engineers, „IEEE Standard for Information technology—Telecommunications and information exchange between systems Local and metropolitan area networks—Specific requirements—Part 11: Wireless LAN Medium Access Control (MAC) and Physical Layer (PHY) Specifications, IEEE Std 802.11-2016 ( Part 1 of 2—pp. 1-2150).

The Institute of Electrical and Electronics Engineers, „IEEE Standard for Information technology—Telecommunications and information exchange between systems Local and metropolitan area networks—Specific requirements—Part 11: Wireless LAN Medium Access Control (MAC) and Physical Layer (PHY) Specifications, IEEE Std 802.11-2016 (Part 2 of 2—pp. 2151-4378).

* cited by examiner

ELECTRICAL CIRCUIT

CROSS-REFERENCE TO RELATED APPLICATIONS

This application is a continuation of copending International Application No. PCT/EP2021/074891, filed Sep. 10, 2021, which is incorporated herein by reference in its entirety, and additionally claims priority from European Application No. 20195749.5, filed Sep. 11, 2020, which is also incorporated herein by reference in its entirety.

TECHNICAL FIELD

Embodiments of the present invention refer to an electrical circuit, especially to an electrical circuit comprising a clock synchronization unit. Also further embodiments refer to a method for clock synchronization and to a corresponding computer program.

BACKGROUND OF THE INVENTION

Oscillators with the same nominal frequency output still differ in the actual clock rate due to the production process, aging and external influences like temperature differences, vibration and shock. Of these especially a physical shock event is able to offset the clock frequency in an unpredictable manner.

In case of a single device with digital to analog converters or analog to digital converters this will cause irregularities in the sampling process of an analog signal or in the synthesis of an analog signal from digital samples. Also clocks signals derived from such degraded clock source will be subject to an unpredictable jitter against the originating clock source. This leads to time and frequency uncertainties in such a digital/analog device or system comprising multiple devices. All of this will result at least in a short term degradation of a device or system performance and in the case of a distributed system will affect and may even prevent the successful communication between the different nodes in the system.

Within the known technology, some synchronization approaches are described. To synchronize clocks of multiple devices a reference signal is used which can be distributed either wired or wirelessly. This reference is typically more precise than the clock source used in the devices and requires an additional clock input. It is used to stabilize the local, permanent clock source and allows to compensate for example a given temperate drift or clock jitter. The required precision is subject to the clock offset requirements of the individual application, which can be some few ppm but may be as low as part of a ppm. Some examples are mains controlled clocks relying on the power grid frequency, cellular base stations relying on GPS derived clock signals and timing information or devices synchronized via protocols like IEEE 1588-2002 (PTP), and radio controlled clocks etc. In case the reference signal is not available the permanent clock source starts to deviate based on its internal accuracy until the reference is available again.

The CN110736957 A describes a clock synchronization method based on electrical energy metering device online testing systems. Another solution is given by the known technology published under https://www.vectron.com/products/shock_vib/shockvibe_index.htm showing oscillator with higher accuracy or higher mechanical integration. Here a shock-tolerant mounting and a temperature control is used to reduce clock uncertainties.

Another most common state of the art solution is based on the principle, not compensating clock uncertainties, but adding margin to reduce the effects. This is at the cost of system capacity and prohibits a full synchronized high speed system. 5G for example realized on guard times called cyclic prefix and uses a so-called timing advance information for compensating transmission delay. Therefore there is a need for an improved approach.

It is an objective of the present invention to provide a concept for improving the synchronization facility, e.g., for sensor nodes or the electrical elements.

SUMMARY

According to an embodiment, an electrical circuit may have: an oscillating element configured to provide a clock signal; and a clock synchronization unit configured to adapt the clock signal based on a reference signal; wherein the clock synchronization unit is configured to extract from an alternating signal the reference signal; wherein the alternating signal is an AC voltage signal of a power grid.

Another embodiment may have a mechanical working machine having the above inventive electrical circuit.

Another embodiment may have a sensor node having the above inventive electrical circuit.

Another embodiment may have a system having one or more above inventive sensor nodes.

Still another embodiment may have a system having one or more above inventive electrical circuits.

According to another embodiment, a method for synchronizing a clock signal may have the steps of: extracting a reference signal from an alternating signal; providing a clock signal by use of an oscillating element; and adapting the clock signal based on the reference signal; wherein the alternating signal is an AC voltage signal of a power grid.

Another embodiment may have a non-transitory digital storage medium having stored thereon a computer program for performing a method for synchronizing a clock signal, having the steps of: extracting a reference signal from an alternating signal; providing a clock signal by use of an oscillating element; and adapting the clock signal based on the reference signal; wherein the alternating signal is an AC voltage signal of a power grid, when said computer program is run by a computer.

Embodiments of the present invention provide an electrical circuit, e.g., of a sensor node, comprising an oscillating element and a clock synchronization unit. The oscillating element is configured to provide a clock signal, e.g., for a transmitter or a ADC (analog-to-digital converter) or DAC (digital-to-analog converter). The clock synchronization unit is configured to adapt the clock signal based on a reference. For this, the clock synchronization unit is configured to extract from an alternating signal, like an AC voltage signal of a power grid the reference signal. According to embodiments, the reference signal may have a frequency of 50 Hz (45 to 55 Hz), 60 Hz (55 to 65 Hz) or a frequency in the range from 5 to 500 Hz or from 0.1 kHz to 5 kHz or from 1 kHz to 10 MHz, or from 1 kHz to 20 MHz. This higher frequency alternating signal may, according to embodiments have an extra signal added to an AC voltage signal of a power grid or to a DC voltage signal e.g. used as a power supply.

Embodiments of the present invention are based on the principle to utilize the power signal of a device as a synchronization means, e.g., for remote nodes that may suffer block deviations due to physical shock events like induced by a forming press, temperature drift, aging or simply static clock offsets. The effect of the features are that a clock source that is not shock proof can be used in conditions that are subjected to physical shock. The advantage is that in wireless communication systems the transmission is not lost or the system performance is not degraded when a physical shock occurs.

The AC signal of a power grid is not very accurate. However, since two elements to be synchronized use the same AC signal, they can be synchronized to each other very accurately, since the one AC signal/grid signal forms the same reference for all elements to be synchronized to each other. Since the AC signal/grid signal is typically available at each component of a mechanical working machine like a forming press, it is possible to avoid extra wiring for transmitting a synchronization signal.

According to the embodiments, the synchronization unit enables an exchange of a higher precision clock (e.g. the local clock) with a net clock source of adjustable frequency. If the system's clock follows a very slow change of frequency of the higher precision clock, then it is according to embodiments proven that the higher precision clock is used as the actual reference. Alternatively, the system will observe the drift of the lower positioned clock, if the higher precision clock is turned off or is subjected to a frequency jump.

According to embodiments, the clock synchronization unit comprises a clock analysis unit which is configured to analyze the clock signal and/or the reference signal with regard to a deviation and/or with regard to a temporal deviation and to activate the clock synchronization unit in case a deviation is larger than a predetermined value. According to embodiments, the clock analysis unit may determine a frequency offset between the reference signal and the clock signal, or a timing behavior of the clocks. For this, the analysis unit performs a processing, e.g., a Fourier transformation or another processing.

The activation may (alternatively) be done as follows. According to embodiments, electrical circuit comprises a shock detector configured to determine a shock and/vibration on the electrical circuit and to activate the clock synchronization unit in case of a shock or vibration being larger than a predetermined value. Background is that the deviation may be measured directly within the clock signal or a reason for the deviated clock signal, e.g., a shock may be determined using a sensor.

Starting from the activation signal, the clock synchronization unit adapts the clock signal. According to embodiments, the adaption may be an indirect adaption or a direct adaption.

For example, the adaption may be performed in that way that the clock signal output by the oscillating element is corrected, e.g., mathematically corrected or combined with a correction signal, e.g., an offset signal. According to further embodiments, the oscillating element can be influenced by the clock synchronization unit. For example, when the oscillating element is part of a voltage control oscillator, the voltage for the voltage control oscillator can be adapted.

Note, the deviation may be a continuous system caused or predictable deviation. Therefore, the clock analysis unit may be configured to determine a continuous deviation between the reference signal and the clock signal, and to store an information on the continuous deviation in a lookup table (cf. additional information signal 19), wherein the clock synchronization unit is configured to perform the synchronization based on the information store in the lookup table.

According to further embodiments, additional information, like a movement or event prediction information (derived from artificial intelligence processing) or further information may be taken into account by the clock synchronization unit (cf. additional information signal 19).

According to embodiments, the electrical circuit is part of a DA converter or an AD converter using the clock signal of the oscillating element. Thus embodiments provide a AD-/DA-Converter using the above electrical circuit. Alternatively, the oscillating element may be part of an oscillator, so that the electrical circuit comprises an oscillator. According to further embodiments, the block signals are used by a transceiver. Therefore, the electrical circuit is part of a transceiver.

According to a further embodiment, a mechanical working machine comprises the electrical circuit. Here, the electrical circuit may be part of a sensor of the mechanical working machine. Another embodiment provides a system comprising one or more sensor nodes. Another embodiment provides a communication system comprising a plurality of (RF) transceiver having the electrical circuit. Here, the sensor nodes may be synchronized to each other based on the common reference signal.

Another embodiment provides a method for synchronizing. A method comprises the following steps: extracting a reference signal from an alternating signal; providing a clock signal by use of an oscillating element; and adapting the clock signal based on the reference signal.

According to embodiments, the method may be computer implemented.

BRIEF DESCRIPTION OF THE DRAWINGS

Below, embodiments will subsequently be discussed referring to the enclosed figures, wherein.

DETAILED DESCRIPTION OF THE INVENTION

Below, embodiments of the present invention will subsequently be discussed referring to the enclosed figures, wherein identical reference numbers are provided to objects having identical or similar function, so that the description thereof is mutually applicable and interchangeable.

Figure 1:
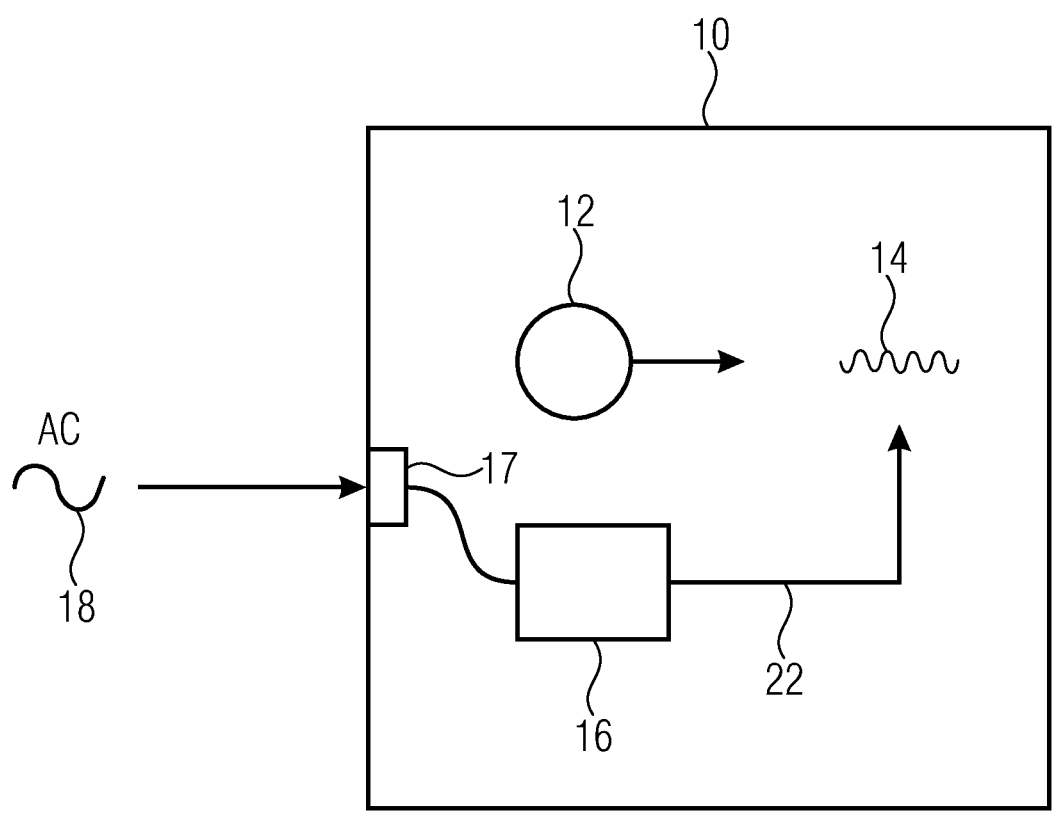
FIG. 1 shows a mathematic block diagram of an electrical circuit according to a basic embodiment.

FIG. 1 shows an electrical circuit 10 comprising an oscillating element 12, e.g., an oscillator or a component of an oscillator like a piezo crystal. The internal oscillating element 12 is configured to output an oscillating signal 14 (internal clock source signal).

Furthermore, the circuit 10 comprises a clock synchronization unit 16 which is connected to an interface 17 for receiving an external alternating signal 18, also referred to as net clock source signal. The clock synchronization unit 16 is configured to adapt the internal clock signal 14 and therefore is somehow connected to the oscillating element 12 or an element (not shown) using the alternating signal.

According to embodiments, the alternating signal 14, also referred to as internal clock source signal, may be used for an AC, DAC and/or a transceiver. Due to environmental circumstances, like an external vibration or external temperature changes, the oscillating element 12/the oscillator 12 can be negatively influenced, so that the oscillating signal 14 has a deviation. Such a large deviation may indicate an event, e.g., a physical shock event having influence to the accuracy of the internal clock signal.

The synchronization unit 16 ensures that the oscillating signal 14 is generated with a deviation below a certain threshold or is corrected so as to have a behavior of an oscillating signal 14 without or with a limited deviation from the ideal. This synchronization is illustrated by the arrow 22. This is done by a synchronization approach. The signal 14 is corrected based on a reference signal, wherein the reference signal is extracted from an external reference signal. According to an embodiment, the reference signal 18' is extracted from an AC voltage of a power grid. Typically, the AC voltage has a frequency of 50 or 60 Hz, wherein the signal can be used as a reference. For this, the entity 16 analyzes the signal 18 received via the interface 17 and extracts, for example, a clock pulse, which can be used as reference. This clock pulse is then compared to the signal 14, which may, for example, have a frequency of 0.5 kHz. Due to the comparison of the two signals, it is clear that each $1000^{th}$ signal should be synchronized. Under this knowledge, the deviation between the two signals can be determined so as to enable a correction of the signal 14.

The result is that the signal 14 can be provided more currently, when compared to a signal without the correction means 16. Typically, it is not an issue that the AC signal 18 is not specified with regard to its accuracy, since the signal has the same behavior every time, especially when more than one electrical circuit 10 uses the same reference signal 18, it can be ensured that these two signals can be synchronized by use of the reference signal 18. It is beneficial that a typically available signal, namely the AC signal of an AC voltage of a power supply is used.

Below, with respect to FIG. 2, further implementations and details will be discussed.

Figure 2:
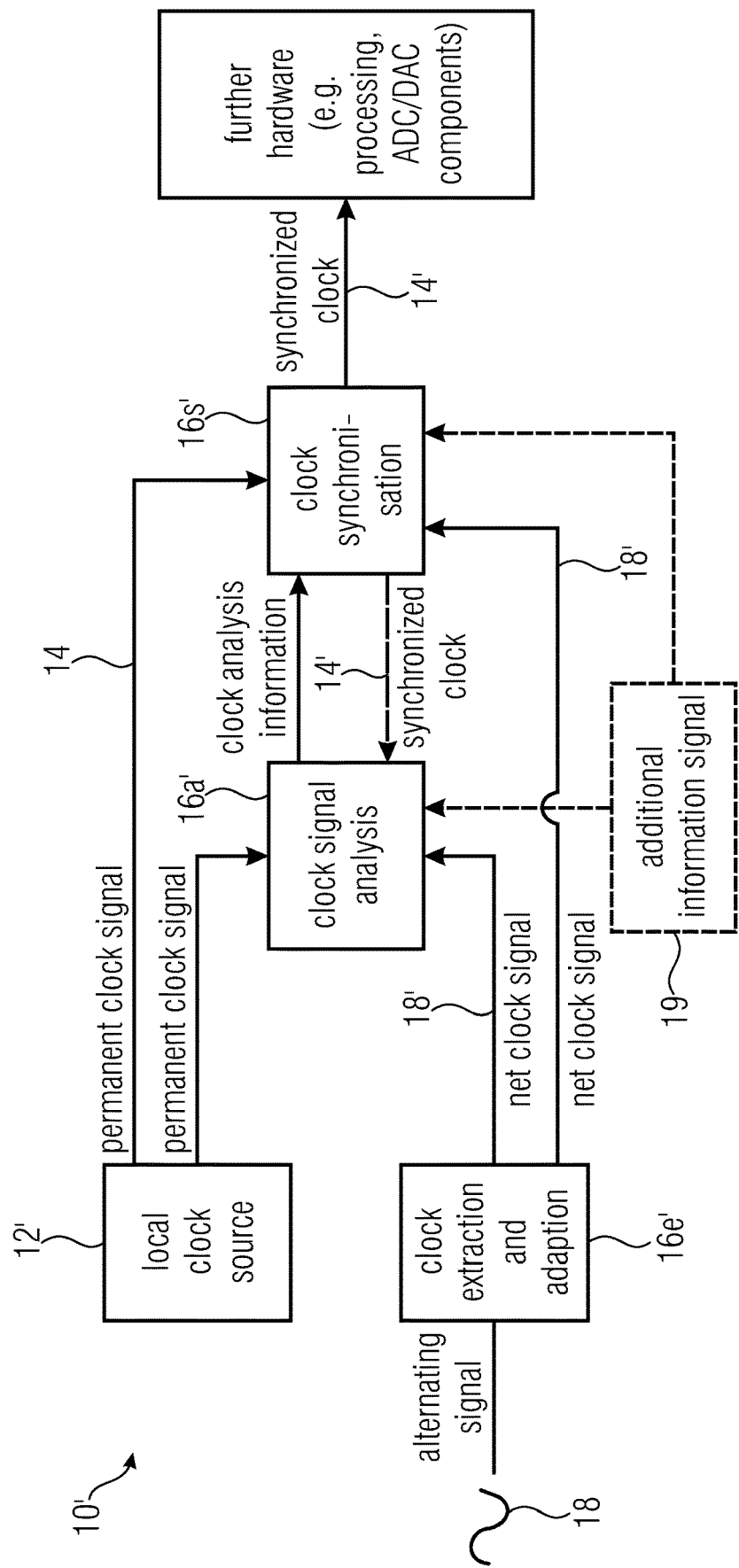
FIG. 2 shows a schematic block diagram of a clock synchronization system according to an enhanced embodiment.

FIG. 2 shows a clock synchronization system. The system comprising the electrical circuit 10' having a local clock source 12', a clock extraction and adaption unit 16e', a clock signal analyzer 16a' and a clock synchronization entity 16s' are comprised by the entity 10'. The local clock source 12' provides the permanent clock signal 14, which is received by the clock analysis stage 16a' and 16s'. The clock analysis stage 16s' receives another signal, namely the so-called net clock signal 18'. This signal 18' is extracted from an alternating signal 18 by the clock extraction and adaption unit 16e'. The clock analysis unit 16a' outputs a clock analysis information to the clock synchronization unit 16s so as to control same. This synchronization unit performs a synchronizing of the permanent clock signal 14 by use of the net clock signal 18'. The synchronized clock 14' is provided to a further hardware, e.g., a processing unit, a DC or DAC component. Since now the structure of the entity 10' has been discussed, its functionality will be discussed.

As discussed in the context of FIG. 1, the synchronization of the signal 14 is done by extracting a clock signal 18' from an alternating signal 18. This clock signal 18' can be the switching frequency of the alternating signal 18, a further signal derived from the switching frequency or an additional signal added onto the alternating signal. The signal may be adapted further in frequency (e.g., increasing or decreasing) or in behavior (e.g., stabilizing via phase locked loop). The resulting signal is then called the net (reference) clock signal 18'. This signal follows in a deterministic manner the drift and switching events of the alternating signal. If, for example, the alternating signal would be a 15 Hz AC signal, it would be subjected to the change in the overall network time management, which regulates the 50 Hz in 0.1 steps, adapting to the overall network load.

In this embodiment, the signal 18' is presented to a clock signal analysis signal unit 16a' together with a signal 14 of a local, permanent oscillator 12', called in the further permanent clock signal. Optionally, further information signals like, for example, the movement prediction information derived from artificial intelligence processing or synchronization information from further external sources like, for example, the later described synchronized clock can be used by the clock analysis unit 16a'. The clock signal analysis unit 16a' is configured to discern at least the frequency of 18' and/or 14 and/or 14' (cf. feedbackloop from 16s'), and also the timing behavior of the frequency offset between the clock signals 18' and 14. It may also rely on prediction and further methods to qualify the clock signals 18/18' and 14/14'. According to embodiments, analysis methods can be for example counting the clock cycles of each clock and analysis of the difference. Another method would be the utilization of digital signal processing (e.g. calculating the Fourier transformed of a signal based on the net clock via the permanent clock and vice versa).

In case of a stable system the deviation or difference between two consecutive measurements is small being subject to the drift between the clock sources. This will even be the case of a failure and recurrence of the net clock. In case of a physical shock event the measurement result will show a larger deviation for a certain amount of time.

This information may be provided to the clock source synchronization unit, which derives a synchronized clock signal from the clock and information signals provided to it. The synchronized clock signal acts as the clock signal for further processing units (e.g. processors, FPGA, ADC, DAC etc.) but can also be fed back to the clock signal analysis unit for the clock behavior characterization.

Under nominal conditions this unit uses the permanent clock to compensate frequency deviations in the net clock. This synchronization is in itself not beyond the state of the art for example done via PLL) but what is beyond is the fact that the permanent clock source is used to synchronize the net clock source. This is normally not done because assuming that the permanent clock is of lower precision than the net clock it does not make sense to degrade a more precise clock signal. Also the net clock may become unavailable, leading to a potential loss of the clock signal. The latter case will obviously not be the case if the alternating current which powers the device is used as the alternating signal.

So consequently it is assumed that the permanent clock is of higher precision than the net clock. By this the net clock is synchronized to the precision of the permanent clock signal, creating the synchronized clock signal which is used as clock source for further processing. This is especially beneficial for synchronous processing chains like fixed sample rate processing with ADCs or DACs. In case the net clock is more precise than the permanent clock it can be used to either synchronize the permanent clock or can be used directly as the synchronized clock signal.

The decision on the selection of the clock signal is controlled by the signal analysis unit.

According to embodiments, the conditions that are not nominal but are addressable by the system comprise at least one of the following. Absence of the net clock, absence of the permanent clock and temporal changes in the permanent clock.

Absence of the net clock: The clock signal analysis will detect this state and the clock synchronization will use the permanent clock as the synchronized clock allowing operation of the overall processing but with potentially degraded system performance in case the permanent clock is of low precision.

Absence of the permanent clock: The clock signal analysis will detect this state and the clock synchronization will use the net clock as the synchronized clock allowing operation of the overall processing but with potentially degraded system performance in case the net clock is of low precision.

This means that the clock synchronization unit uses the reference signal or a signal derived from the reference signal as clock signal in case of a deviation larger than a predetermined value or in case the clock signal is not available.

Temporal changes in the permanent clock: In case of fast temporal changes or variations of the permanent clock, the synchronization of the clocks may, for example, stopped and the synchronized clock will start to behave according to the net clock.

Starting from this, the clock synchronization unit 16s' may have the following system behavior in case of a fast temporal change of permanent clock e.g., due to physical shock. This system behavior is illustrated by FIG. 3.

Figure 3:
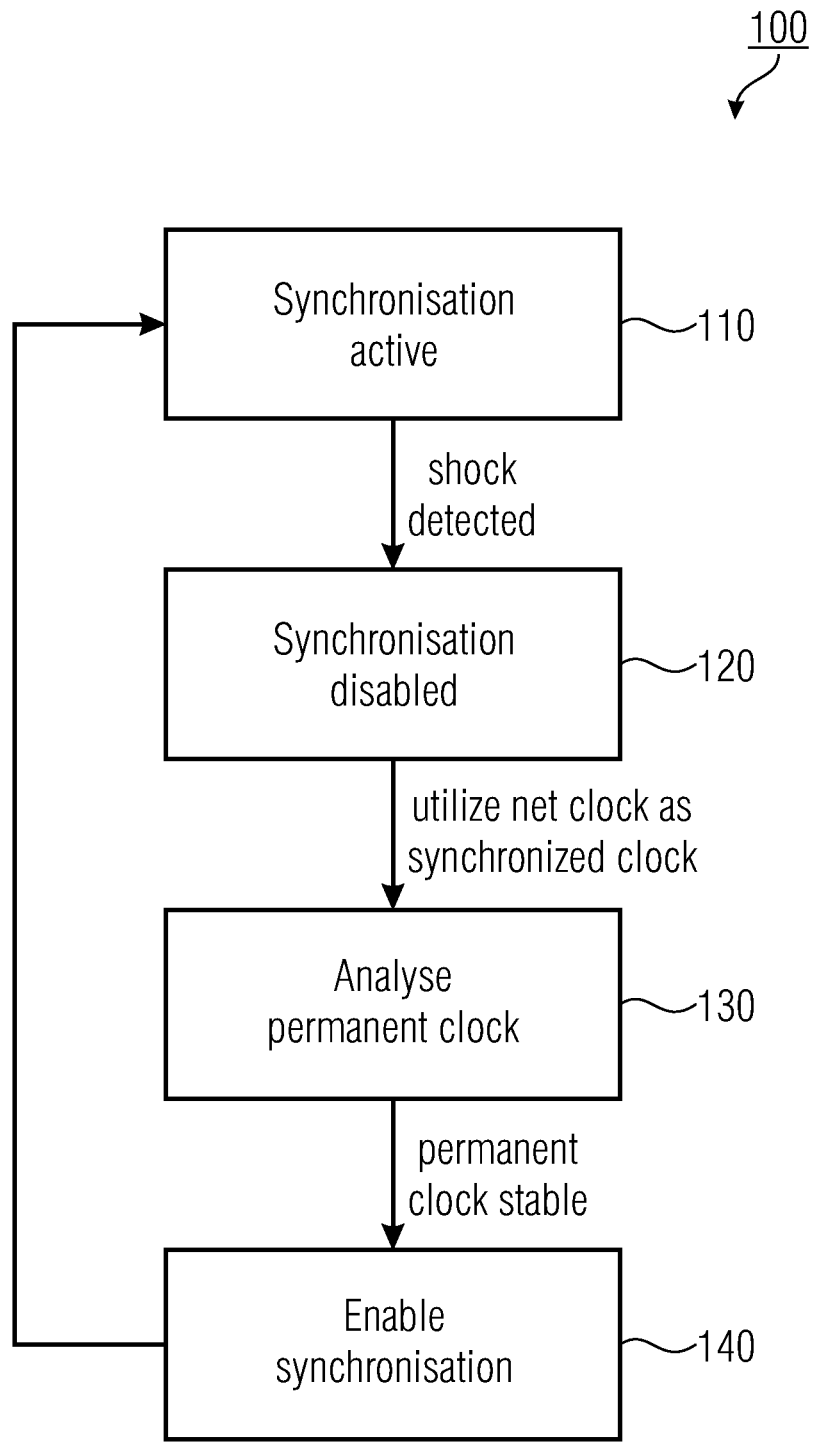
FIG. 3 shows a schematic flow chart illustrating the system behaviors of fast and parallel changes of common clock, (e.g., due to physical shock) to illustrate enhanced embodiments.
Figure 4:
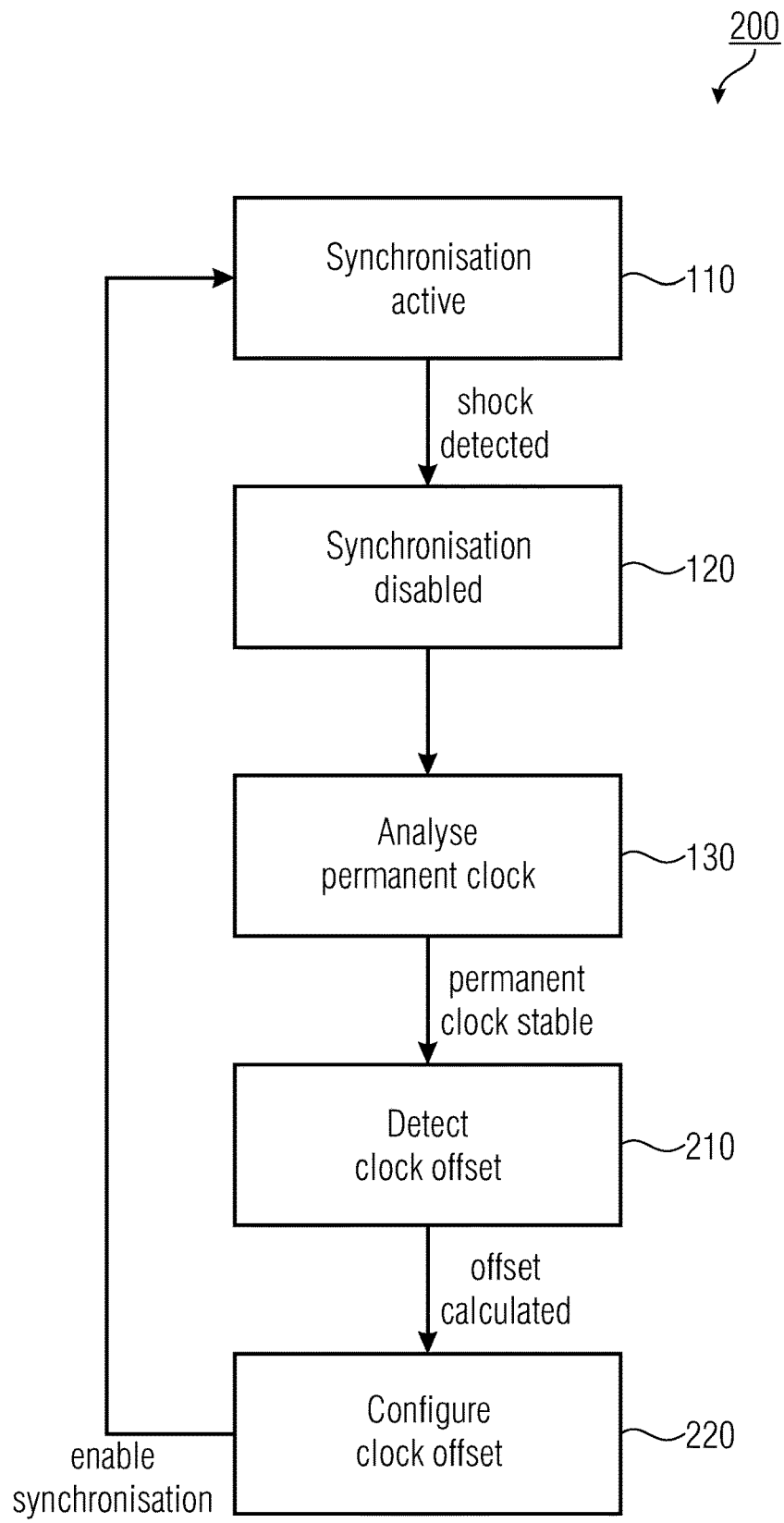
FIG. 4 shows a schematic flow diagram of a synchronization state machine according to embodiments.

FIG. 3 shows a flowchart 100 illustrating the behavior in case of a temporal change. The method 100 comprises the four steps 110, 120, 130 and 140. In the first phase 110 the synchronization is active. This means that the signals 14 and 18' are synchronized in the usual manner, wherein a shock detection is enabled. A physical shock even to the permanent clock 12' can cause a temporal asynchronous behavior. Therefore, in the phase 120 the synchronization is disabled when a shock is detected. As a consequence of the phase 120, the net clock is utilized as synchronized clock, wherein a permanent clock analysis is performed (cf. reference number 130). When a permanent clock being stable is determined again, the synchronization is enabled again (cf. step 140). The latter case can be caused by a physical shock event to the permanent clock which can also lead to a persistent change in the permanent clock frequency. This situation is illustrated by FIG. 4 illustrating the method 200. The method 200 comprises the steps 100, 120, 130, a step 210 and a step 220. Thus, the last step 140 of method 100 is replaced by the two steps 210 and 220. After the step 130, the permanent clock is stable again, wherein the persistent change has been caused. Within the step 210, the clock offset is detected. To compensate this additional effect, the clock analysis unit 16a' utilizes the result of the deviation measurement between the clocks (cf. reference number 210), which may be combined together with stored reference values, obtained under nominal conditions or provided from external source. This information is provided to the synchronization unit as a correction value (cf. step 220) to minimize a potential resulting synchronization clock offset.

According to embodiments, the clock synchronization unit 16s' is configured to process the extracted signal; (1.) during normal conditions (e.g. without any shock event) so as to obtain processing parameters and to store the processing parameters) like filter parameters (low pass filtering, smoothing, etc.) or multiplication parameters for multiplying the signal 18 (so as to obtain 18'). These processing parameters enable an improved generation of the reference signal and can according to further embodiments (2.) used for the generating of the reference signal during a shock event. By use of this processing parameters the signal 18' may optionally be adapted to the local signal 14 being at least during normal conditions more accurate.

Figure 5:
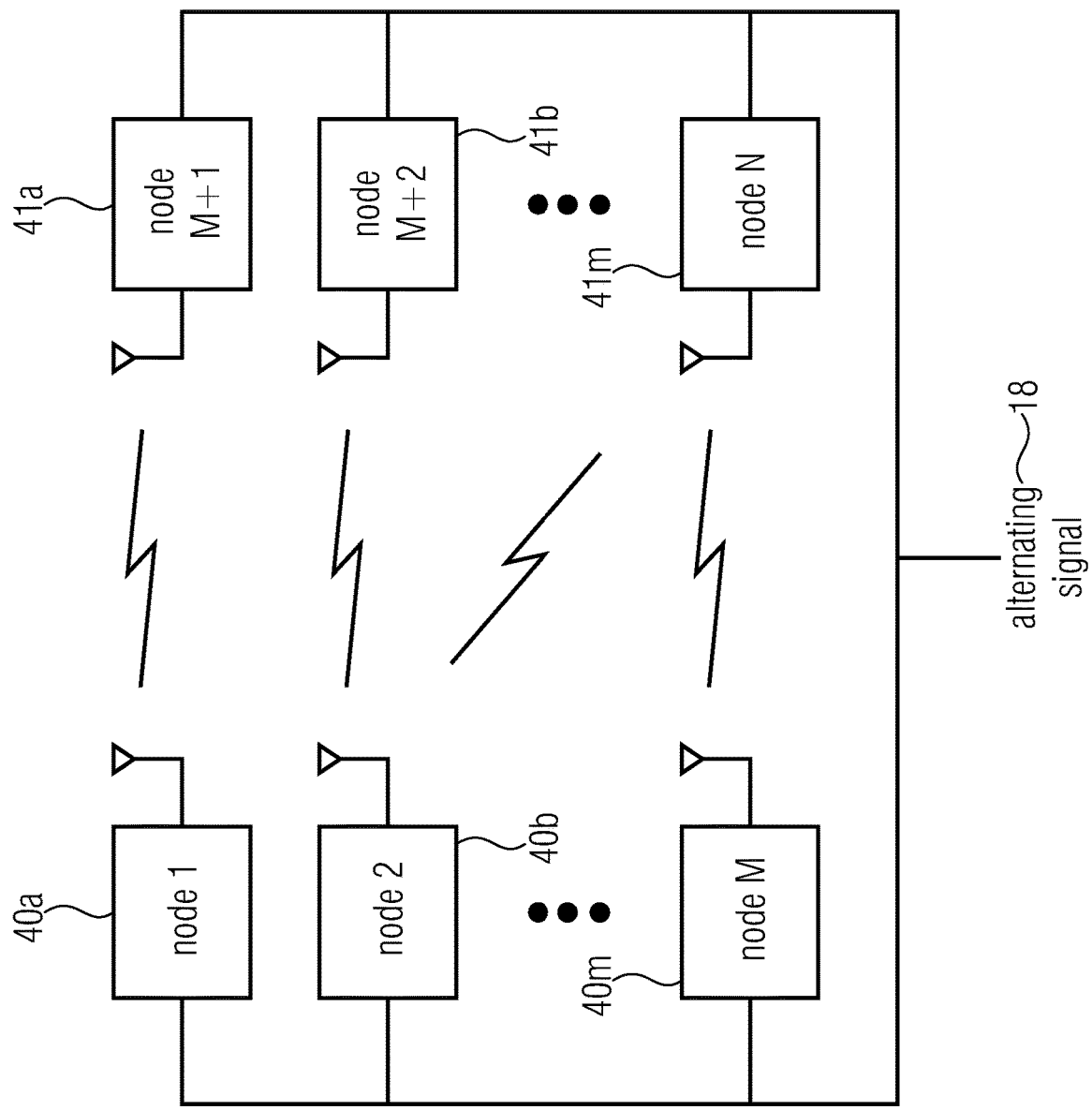
FIG. 5 shows a schematic block diagram of a system having a plurality of nodes synchronized to each other according to further embodiments.

With respect to FIG. 5, the above-described methods 100 and 200, especially the approach discussed in context of FIG. 1 and FIG. 2 will be discussed in context of a distributed system where a plurality of nodes are connected to each other, wherein the alternating signal used by the nodes may suffer from the drifts and variations of the alternating signal. FIG. 5 shows a usage of the plurality of nodes 40a to 40m all having an antenna and/or transmitter for communicating with other nodes 41a to 41n. Support sensor nodes typically use a very simple communication protocol so as to avoid signal overhead, etc. However, a transmission typically uses a stable clock for the transceiver. Here, the internal clock (cf. 12 of FIG. 1 or 12' of FIG. 1') is stabilized/corrected by the above-described synchronization approach (cf. method 100 or 200). For this, all sensor nodes 40a to 40m and 41a to 41n use the same alternating signal 18 as a reference or extract from the same alternating signal 18 a reference signal.

Assuming that the above-mentioned effects of drift and variations of the internal alternating signal are the same at all nodes 40a to 41n, the variations that include the nodes are identical. This leads to a synchronous jitter of the distributed system. Here, the nodes 40a-41n are synchronized by alternating signal 18.

By this the system is already coarsely synchronized even before the wireless transmission system is up and running and will not degrade due to physical shock events. As the nodes communicate wirelessly with each other they are able to exchange further timing information. This information may for example consist of the time variation of the net signal, relative time information between the nodes (like for example as a time or frequency offset) or absolute time information. This leads to a system which is able to startup very quickly, which is able to compensate short times of permanent clock disturbances like from a physical shock event and can compensate dynamic clock offset changes.

In some cases of the nodes 40a-41n are powered by a direct current, the power supplies are only used to apply the alternating signal to the DC lines which typically is considered a parasitic effect in AC/DC coupling. Nevertheless, this effect can also be applied intentionally via modulating the alternating signal 18, on a DC rail.

A potential use case for the above-described principle of clock synchronization is a wireless transceiver mounted on electrical/mechanical machines like for example a forming press or a robot arm. Further embodiments provide a principle for synchronization of a system consisting of multiple nodes only connected via power cable and a wireless communicating to each other. Thus, a further application is a wireless communication system.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An electrical circuit, comprising:
   an oscillating element configured to provide a clock signal; and
   a clock synchronization unit configured to adapt the clock signal based on a reference signal;
   wherein the clock synchronization unit is configured to extract from an alternating signal the reference signal;
   wherein the alternating signal is an AC voltage signal of a power grid.

2. The electrical circuit according to claim 1, wherein the reference signal comprises a frequency of 50 Hz, 60 Hz or a frequency in the range between 45 Hz and 55 Hz or 55 Hz and 60 Hz, 5 and 500 Hz, or 0.1 and 5 kHz, or 1 kHz and 10 MHz, or 1 kHz and 20 MHz.

3. The electrical circuit according to claim 1, wherein the reference signal is an extra signal added to an AC voltage signal of a power grid, especially to an DC voltage of a power grid, or to another DC voltage.

4. The electrical circuit according to claim 1, wherein the clock synchronization unit comprises a clock analysis unit which is configured to analyze the clock signal with respect to the reference signal so as to determine whether a synchronization is acquired.

5. The electrical circuit according to claim 4, wherein the clock analysis unit is configured to analyze the clock signal and/or the reference signal with regard to a deviation and/or with regard to a temporal deviation, especially with regard to a temporal deviation from the current clock signal, and/or with regard to an offset and/or with regard to a quality of the oscillating element; or
   to activate the clock synchronization unit in case of a deviation larger than a predetermined value.

6. The electrical circuit according to claim 4, wherein the clock analysis unit is configured to analyze the clock signal and/or the reference signal with regard to its availability and/or with regard to a deviation and/or with regard to a temporal deviation or to an offset of the clock signal; or
   wherein the clock synchronization unit uses the reference signal or a signal derived from the reference signal as clock signal in case of a deviation larger than a predetermined value or in case the clock signal is not available.

7. The electrical circuit according to claim 4, wherein the clock analysis unit is configured to determine a continuous deviation between the reference signal and the clock signal and to store an information on the continuous deviation in a lookup table; or
   wherein the clock synchronization unit is configured to perform the synchronization based on the information stored in the lookup table or to perform the synchronization so as to compensate an offset or continuous deviation.

8. The electrical circuit according to claim 1, wherein the electrical circuit comprises a shock detector configured to determine a physical shock and/or vibration on the electrical circuit and to activate the clock synchronization unit in case of a shock or vibration disturbance larger than a predetermined value.

9. The electrical circuit according to claim 1, wherein the oscillating element is comprised by a DA converter, by an AD converter or by an oscillator.

10. The electrical circuit according to claim 1, wherein the clock synchronization unit is configured to perform the synchronization based on information on an offset or a continuous deviation so as to compensate the offset or the continuous deviation or to perform the synchronization based a movement or event prediction.

11. The electrical circuit according to claim 1, wherein the clock synchronization unit is configured to process the extracted signal and to store processing parameters to be used to for generating the reference signal.

12. A mechanical working machine comprising the electrical circuit according to claim 1.

13. A sensor node comprising the electrical circuit according to claim 1.

14. A system comprising one or more sensor nodes according to claim 13.

15. The system according to claim 14, wherein at least two of one or more sensor nodes use the reference signal to synchronize.

16. A system comprising one or more electrical circuits according to claim 1.

17. The system according to claim 16, wherein the one or more electrical circuits are part of a transceiver so as to form a communication network.

* * * * *